(12) United States Patent
Huang

(10) Patent No.: US 11,776,598 B2
(45) Date of Patent: Oct. 3, 2023

(54) DATA PROCESSING CIRCUIT AND DEVICE

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/409,674

(22) Filed: Aug. 23, 2021

(65) Prior Publication Data

US 2022/0301606 A1 Sep. 22, 2022

Related U.S. Application Data

(63) Continuation of application No. PCT/CN2021/104344, filed on Jul. 2, 2021.

(30) Foreign Application Priority Data

Mar. 19, 2021 (CN) .......................... 202110296073.X

(51) Int. Cl.
*G11C 7/22* (2006.01)
*G11C 7/10* (2006.01)
*G11C 5/06* (2006.01)

(52) U.S. Cl.
CPC ................ *G11C 7/222* (2013.01); *G11C 5/06* (2013.01); *G11C 7/1048* (2013.01); *G11C 7/1069* (2013.01); *G11C 7/1096* (2013.01)

(58) Field of Classification Search
CPC ......... G11C 7/222; G11C 5/06; G11C 7/1048; G11C 7/1069; G11C 7/1096

(Continued)

(56) References Cited

U.S. PATENT DOCUMENTS 6,351,427 B1 2/2002 Brown
7,146,454 B1 * 12/2006 Li .......................... G11C 11/406
711/6

(Continued)

FOREIGN PATENT DOCUMENTS

CN 102097122 A 6/2011
CN 107015916 A 8/2017

(Continued)

OTHER PUBLICATIONS

Russia Patent Office, Office Action Issued in Application No. 2022121308/28, dated Feb. 17, 2023, 7 pages.

(Continued)

*Primary Examiner* — Huan Hoang
(74) *Attorney, Agent, or Firm* — KILPATRICK TOWNSEND & STOCKTON LLP

(57) ABSTRACT

An embodiment provides a data processing circuit and a device. The circuit includes: a first bank group 201 and a second bank group 202; a write circuit 203; and a read circuit 204. The write circuit 203 includes a write input cache circuit 2031, and is configured to: receive stored data from a write bus 206 through the write input cache circuit 2031, write the stored data into the first bank group 201 through a first read-write bus 207, and write the stored data into the second bank group 202 through a second read-write bus 208. The read circuit 204 includes a read output cache circuit 2041, and is configured to: read the stored data from the first bank group 201 through the first read-write bus 207, and read the stored data from the second bank group 202 through the second read-write bus 208.

16 Claims, 13 Drawing Sheets

(58) Field of Classification Search
USPC .................................................. 365/233.1
See application file for complete search history.

(56) References Cited

U.S. PATENT DOCUMENTS

| | | |
|---|---|---|
| 2005/0166026 A1 | 7/2005 | Ware et al. |
| 2006/0171234 A1 | 8/2006 | Liu et al. |
| 2008/0162857 A1 | 7/2008 | Oh |
| 2009/0010091 A1 | 1/2009 | Fujisawa |
| 2016/0267971 A1 | 9/2016 | Maejima |
| 2016/0365131 A1 | 12/2016 | Kim et al. |
| 2018/0315486 A1 | 11/2018 | Maejima et al. |
| 2019/0244655 A1 | 8/2019 | Penney |
| 2019/0347219 A1 | 11/2019 | Ho |
| 2020/0312386 A1 | 10/2020 | Inada et al. |
| 2020/0387078 A1 | 12/2020 | Muto |
| 2022/0300440 A1 | 9/2022 | Ootomo et al. |

FOREIGN PATENT DOCUMENTS

| | | |
|---|---|---|
| CN | 111694514 A | 9/2020 |
| CN | 111755041 A | 10/2020 |
| JP | H11273335 A | 10/1999 |
| JP | 2020166346 A | 10/2020 |
| RU | 2507611 C1 | 2/2014 |

OTHER PUBLICATIONS

United States Patent and Trademark office, Non-Final Office action received in related U.S. Appl. No. 17/396,743 dated May 10, 2023.
European Patent Office, Extended European Search Report Issued in Application No. 21908093.4, dated Jun. 6, 2023, Germany, 9 pages.
Japanese Patent Office, first office action Issued in related Application No. 2022-549667, dated Aug. 1, 2023, 8 pages.

* cited by examiner

DATA PROCESSING CIRCUIT AND DEVICE

CROSS REFERENCE TO RELATED APPLICATION

This application is a continuation of PCT/CN2021/104344, filed on Jul. 2, 2021, which claims priority to Chinese Patent Application No. 202110296073.X titled "DATA PROCESSING CIRCUIT AND DEVICE" and filed to the State Intellectual Property Office on Mar. 19, 2021, the entire contents of which are incorporated herein by reference.

TECHNICAL FIELD

The present disclosure relates to, but is not limited to, a data processing circuit and a device.

BACKGROUND

In a memory, data are stored in memory arrays, and there may be one or more memory arrays in the memory. One of common memories may be a dynamic random access memory (DRAM), which is a RAM memory. To improve read-write efficiency of the DRAM, in a double data rate (DDR) DRAM, an internal memory array is generally divided into a plurality of bank groups (BGs), and cross read-write is carried out between different BGs. Data lines connected to each of the plurality of BGs need to be merged in a central region, and the merged data lines share one data bus to implement data reading.

However, in the above solution, the central region has a larger circuit size.

SUMMARY

An embodiment of the present disclosure provides a data processing circuit and a device. The data processing circuit includes:

a first bank group and a second bank group;

a write circuit, comprising a write input cache circuit, the write circuit being configured to: receive stored data from a write bus through the write input cache circuit, write the stored data into the first bank group through a first read-write bus, and write the stored data into the second bank group through a second read-write bus; and a read circuit, comprising a read output cache circuit, the read circuit being configured to: read the stored data from the first bank group through the first read-write bus, read the stored data from the second bank group through the second read-write bus, and transmit the stored data to a read bus through the read output cache circuit.

An embodiment of the present disclosure also provides memory, which includes:

two of the data processing circuits, wherein the write circuits in the two data processing circuits are connected to the same write bus, and the read circuits in the two data processing circuits are connected to the same read bus.

An embodiment of the present disclosure also provides an electronic device, which includes the above memory.

An embodiment of the present disclosure provides a data processing circuit and a device. The data processing circuit includes: a first bank group and a second bank group; a write circuit; and a read circuit. The write circuit includes a write input cache circuit, and the write circuit is configured to: receive stored data from a write bus through the write input cache circuit, write the stored data into the first bank group through a first read-write bus, and write the stored data into the second bank group through a second read-write bus. The read circuit includes a read output cache circuit, and the read circuit is configured to: read the stored data from the first bank group through the first read-write bus, read the stored data from the second bank group through the second read-write bus, and send the stored data to a read bus through the read output cache circuit. In this embodiment of the present disclosure, each of the write circuits includes one write input cache circuit, and each of the read circuits includes one read output cache circuit. The write circuits and the read circuits are positioned in a central region, such that a circuit size of the central region can be reduced.

DETAILED DESCRIPTION

A clear and complete description of the technical schemes in the embodiments of the present disclosure is made in conjunction with the accompanying drawings in the embodiments of the present disclosure. Obviously, the embodiments as recited herein are merely a part of embodiments of the present disclosure instead of all embodiments. All other embodiments obtained by a person of ordinary skill in the art based on the embodiments of the present disclosure without creative efforts shall fall within the protection scope of the present disclosure.

It should be explained that in the specification, the claims and the foregoing accompanying drawings of the present disclosure, a term such as "first" "or" "second" is intended to separate between similar objects but is not intended to describe a particular sequence or precedence order. It is to be understood that data used like this may be interchangeable where appropriate, so that the embodiments of the present disclosure described herein can be implemented in sequences excluding those illustrated or described herein.

Furthermore, terms such as "comprise", "have" or other variants thereof are intended to cover a non-exclusive "comprise", for example, processes, methods, systems, products or devices comprising a series of steps or units are not limited to these steps or units listed explicitly, but comprise other steps or units not listed explicitly, or other steps or units inherent to these processes, methods, systems, products or devices.

The embodiments of the present disclosure may be applied to data access scenarios, for example, writing stored data into a memory or reading the stored data from the memory. The memory in the embodiments of the present disclosure is a RAM memory.

Figure 1:
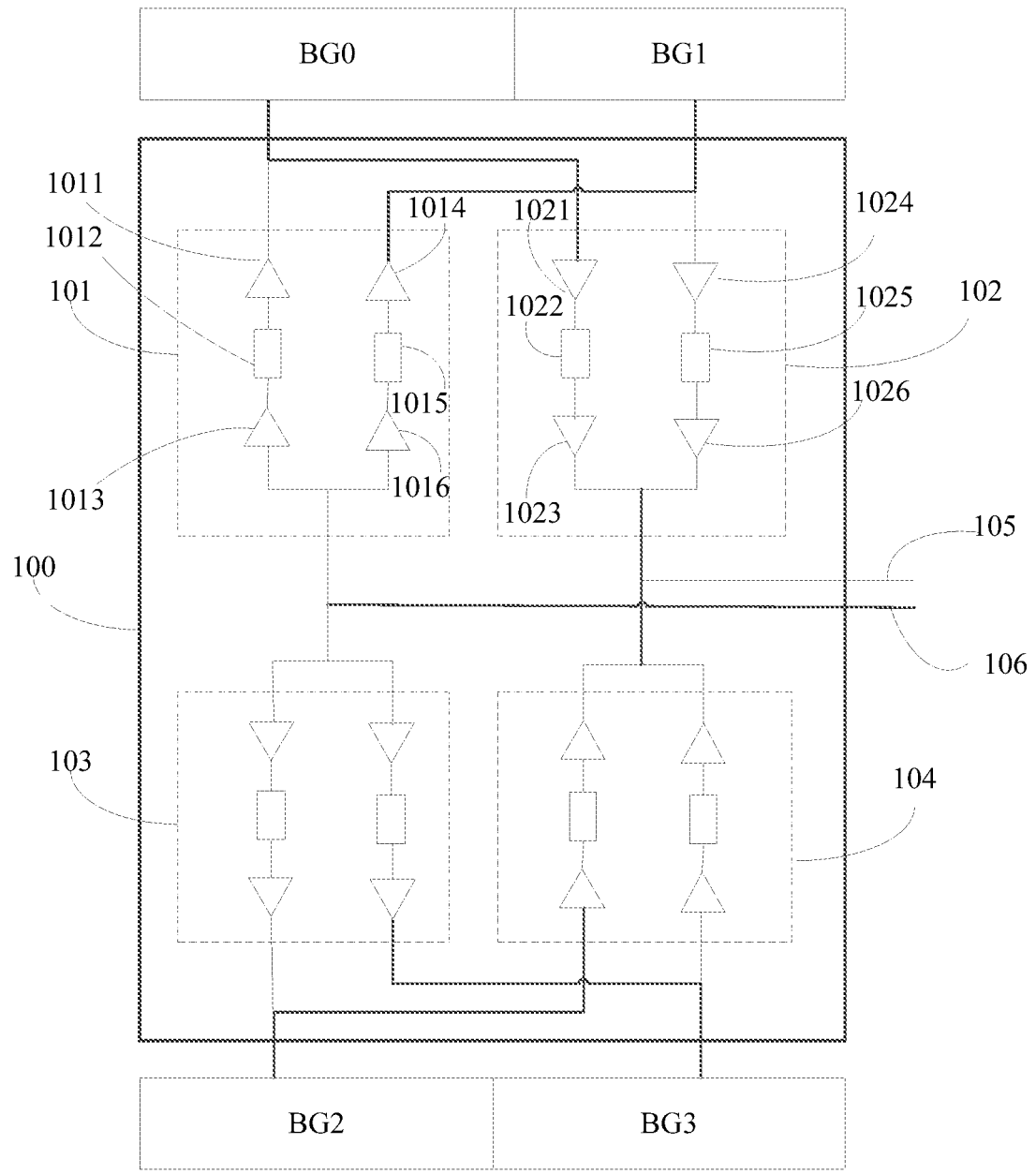
FIG. 1 schematically illustrates a schematic structural diagram of a DDR DRAM memory in the prior art.

FIG. 1 schematically illustrates a schematic structural diagram of a double data rate (DDR) dynamic random access memory (DRAM) in the prior art. With reference to FIG. 1, the DDR DRAM includes four bank groups (BGs) configured to store data: BG0, BG1, BG2, and BG3. The BG0 and the BG1 are arranged in parallel in one row, the BG2 and the BG3 are arranged in parallel in another row, and the row where the BG0 and the BG1 are positioned is in parallel to the row where the BG2 and the BG3 are positioned.

In addition, there exists one central region 100 between the above two rows, and circuits in the central region 100 are configured to control writing stored data into each BG or reading the stored data from each BG. There are four circuits in the central region 100: a write circuit 101, a write circuit 103, a read circuit 102, and a read circuit 104.

The write circuit 101 is configured to write the stored data in a write bus 106 into the BG0 and the BG1. The write circuit 103 is configured to write the stored data in the write bus 106 into the BG2 and the BG3. The read circuit 102 is configured to send the stored data read from the BG0 and the BG1 to a read bus 105. The read circuit 104 is configured to send the stored data read from the BG2 and the BG3 to the read bus 105.

The stored data in the write bus 106 are stored data obtained from a data queue (DQ).

The above-mentioned write circuit 101 includes a write input cache circuit 1013 and a write input cache circuit 1016, a write control circuit 1012 and a write control circuit 1015, a write output cache circuit 1011, and a write output cache circuit 1014.

As can be seen, the write input cache circuit 1013, the write control circuit 1012 and the write output cache circuit 1011 are configured to write the stored data into the BG0. The write input cache circuit 1016, the write control circuit 1015 and the write output cache circuit 1014 are configured to write the stored data into the BG1.

One terminal of the write input cache circuit 1013 is connected to the write bus 106, and the other terminal of the write input cache circuit 1013 is connected to the write control circuit 1012, to send the stored data obtained from the write bus 106 to the write control circuit 1012.

One terminal of the write control circuit 1012 is connected to the write input cache circuit 1013, and the other terminal of the write control circuit 1012 is connected to the write output cache circuit 1011, to send the stored data received from the write input cache circuit 1013 to the write output cache circuit 1011.

One terminal of the write output cache circuit 1011 is connected to the write control circuit 1012, and the other terminal of the write output cache circuit 1011 is connected to the BG0, to send the stored data received from the write control circuit 1012 to the BG0.

Similarly, one terminal of the write input cache circuit 1016 is connected to the write bus 106, and the other terminal of the write input cache circuit 1016 is connected to the write control circuit 1015, to send the stored data received from the write bus 106 to the write control circuit 1015.

One terminal of the write control circuit 1015 is connected to the write input cache circuit 1016, and the other terminal of the write control circuit 1015 is connected to the write output cache circuit 1014, to send the stored data received from the write input cache circuit 1016 to the write output cache circuit 1014.

One terminal of the write output cache circuit 1014 is connected to the write control circuit 1015, and the other terminal of the write output cache circuit 1014 is connected to the BG1, to send the stored data received from the write control circuit 1015 to the BG1.

It is to be understood that the write circuit 103 is the same as the write circuit 101 in structure, and is different from the write circuit 101 in that the two write output cache circuits in the write circuit 103 are connected to the BG2 and the BG3 respectively, to write the stored data into the BG2 and the BG3.

The read circuit 102 includes a read output cache circuit 1023 and a read output cache circuit 1026, a read control circuit 1022 and a read control circuit 1025, a read input cache circuit 1021, and a read input cache circuit 1024.

As can be seen, the read input cache circuit 1021, the read control circuit 1022 and the read output cache circuit 1023 are configured to read the stored data from the BG0. The read input cache circuit 1024, the read control circuit 1025 and the read output cache circuit 1026 are configured to read the stored data from the BG1.

One terminal of the read input cache circuit 1021 is connected to the BG0, and the other terminal of the read input cache circuit 1021 is connected to the read control circuit 1022, to send the stored data read from the BG0 to the read control circuit 1022.

One terminal of the read control circuit 1022 is connected to the read input cache circuit 1021, and the other terminal of the read control circuit 1022 is connected to the read output cache circuit 1023, to send the stored data received from the read input cache circuit 1021 to the read output cache circuit 1023.

One terminal of the read output cache circuit 1023 is connected to the read control circuit 1022, and the other terminal of the read output cache circuit 1023 is connected to the read bus 105, to send the stored data received from the read control circuit 1022 to the read bus 105.

Similarly, one terminal of the read input cache circuit 1024 is connected to the BG1, and the other terminal of the read input cache circuit 1024 is connected to the read control circuit 1025, to send the stored data read from the BG1 to the read control circuit 1025.

One terminal of the read control circuit 1025 is connected to the read input cache circuit 1024, and the other terminal of the read control circuit 1022 is connected to the read output cache circuit 1026, to send the stored data received from the read input cache circuit 1024 to the read output cache circuit 1026.

One terminal of the read output cache circuit 1026 is connected to the read control circuit 1025, and the other terminal of the read output cache circuit 1023 is connected to the read bus 105, to send the stored data received from the read control circuit 1025 to the read bus 105.

It is to be understood that the read circuit 104 is the same as the read circuit 102 in structure, and is different from the read circuit 102 in that the two read input cache circuits in the read circuit 104 are connected to the BG2 and the BG3 respectively, to send the stored data in the BG2 and the BG3 to the read bus 105.

However, the central region 100 of the above memory has a larger circuit size.

To solve the above problems, after a study on the above circuits is made, it is found that writing the stored data into the BG0 and writing the stored data into the BG1 are performed alternately, and are different in write time, so there is no write conflict between the BG0 and the BG1. In addition, reading the stored data from the BG0 and reading the stored data from the BG1 are also performed alternately, and are different in read time, so there is no read conflict between the BG0 and the BG1. Similarly, neither write conflict nor read conflict exists between the BG2 and the BG3.

Based on the above findings, in some embodiments of the present disclosure, at least one type of the following circuits may be merged: the write input cache circuits corresponding to the BG0 and the BG1, the write control circuits corresponding to the BG0 and the BG1, the read output cache circuits corresponding to the BG0 and the BG1, the read control circuits corresponding to the BG0 and the BG1, the write input cache circuits corresponding to the BG2 and the BG3, the write control circuits corresponding to the BG2 and the BG3, the read output cache circuits corresponding to the BG2 and the BG3, and the read control circuits corresponding to the BG2 and the BG3. In this way, after the circuits are merged, the circuit size of the central region can be reduced.

The following embodiments may be combined with each other, and the same or similar concepts or processes may not be repeated in some embodiments. The embodiments of the present disclosure will be described below with reference to the accompanying drawings.

Figure 2:
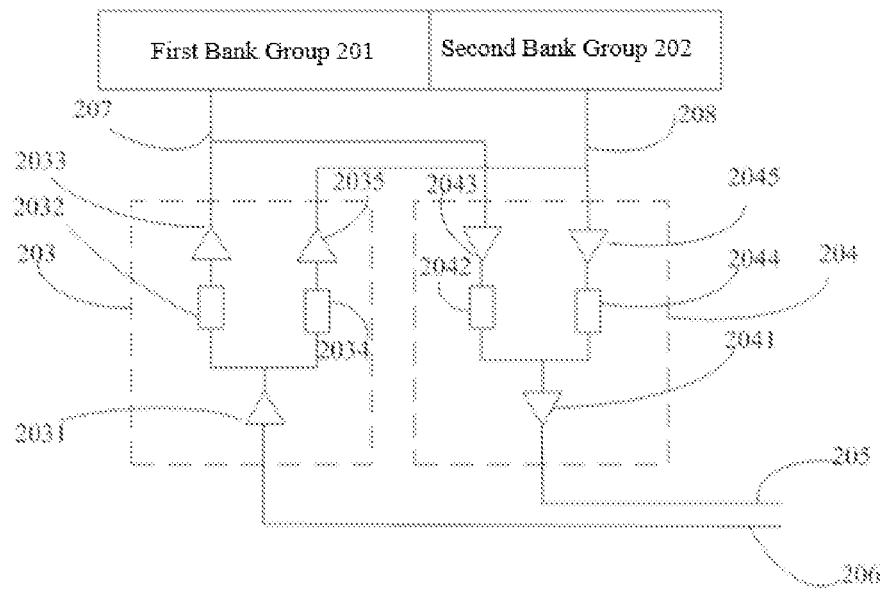
FIG. 2 and FIG. 3 schematically illustrate schematic structural diagrams of two data processing circuits according to some embodiments of the present disclosure.
Figure 3:
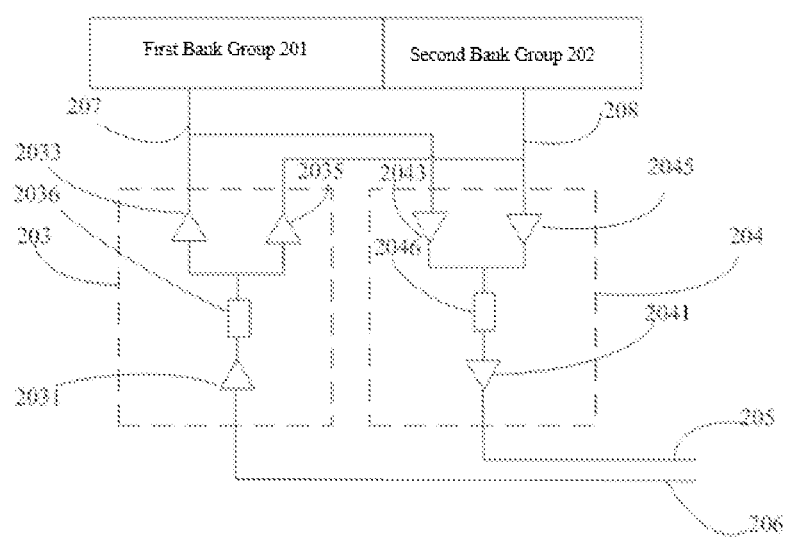

FIG. 2 and FIG. 3 schematically illustrate schematic structural diagrams of two data processing circuits according to some embodiments of the present disclosure. With reference to FIG. 2 and FIG. 3, the data processing circuit mainly includes:

a first bank group 201 and a second bank group 202; a write circuit 203; and a read circuit 204. The write circuit 203 includes a write input cache circuit 2031. The write circuit 203 is configured to: receive stored data from a write bus 206 by means of the write input cache circuit 2031, write the stored data into the first bank group 201 by means of a first read-write bus 207, and write the stored data into the second bank group 202 by means of a second read-write bus 208. The read circuit 204 includes a read output cache circuit 2041. The read circuit 204 is configured to: read the stored data from the first bank group 201 by means of the first read-write bus 207, read the stored data from the second bank group 202 by means of a second read-write bus 208, and send the stored data to a read bus 205 by means of the read output cache circuit 2041.

The first bank group 201 and the second bank group 202 are different in data read-write time. The first bank group 201 and second bank group 202 are two bank groups configured to alternately store data, and also they are two bank groups configured to alternately write the stored data. That is, the stored data are alternately written into the first bank group 201 and the second bank group 202, and the stored data are alternately read from the first bank group 201 and the second bank group 202. In addition, the first bank group 201 and the second bank group 202 are the same in data read-write logic. Thus, the write circuit of the first bank group 201 and the write circuit of the second bank group 202 may be merged, and the read circuit of the first bank group 201 and the read circuit of the second bank group 202 may be merged. For example, when the first bank group 201 is the BG0 in FIG. 1, the second bank group 202 is the BG1. When the first bank group 201 is the BG2 in FIG. 1, the second bank group 202 is the BG3.

As can be seen from FIG. 2, the above write circuit 203 includes: a write input cache circuit 2031, a first write control circuit 2032, a second write control circuit 2034, a first write output cache circuit 2033, and a second write output cache circuit 2035.

The write input cache circuit 2031 is respectively connected to the write bus 206, the first write control circuit 2032 and the second write control circuit 2034, to send the stored data obtained from the write bus 206 to the first write control circuit 2032 and the second write control circuit 2034.

The first write control circuit 2032 is respectively connected to the write input cache circuit 2031 and the first write output cache circuit 2033, to send the stored data sent by the write input cache circuit 2031 to the first write output cache circuit 2033.

The second write control circuit 2034 is respectively connected to the write input cache circuit 2031 and the second write output cache circuit 2035, to send the stored data sent by the write input cache circuit 2031 to the second write output cache circuit 2035. The first write output cache circuit 2033 is respectively connected to the first write control circuit 2032 and the first bank group 201, to send the stored data sent by the first write control circuit 2032 to the first bank group 201.

The second write output cache circuit 2035 is respectively connected to the second write control circuit 2034 and the second bank group 202, to send the stored data sent by the second write control circuit 2034 to the second bank group 202.

The first write output cache circuit 2033 is connected to the first bank group 201 through the first read-write bus 207, and the second write output cache circuit 2035 is connected to the second bank group 202 through the second read-write bus 208. In some embodiments of the present disclosure, the stored data in the write bus 206 may be written into the first bank group 201 through the write input cache circuit 2031, the first write control circuit 2032 and the first write output cache circuit 2033 in FIG. 2. The stored data in the write bus 206 may be written into the second bank group 202 through the write input cache circuit 2031, the second write control circuit 2034, and the second write output cache circuit 2035.

As can be seen from FIG. 2, the read circuit 204 includes: a read output cache circuit 2041, a first read control circuit 2042, a second read control circuit 2044, a first read input cache circuit 2043, and a second read input cache circuit 2045.

The first read input cache circuit 2043 is respectively connected to the first bank group 201 and the first read control circuit 2042, to send the stored data obtained from the first bank group 201 to the first read control circuit 2042.

The second read input cache circuit 2045 is respectively connected to the second bank group 202 and the second read control circuit 2044, to send the stored data obtained from the second bank group 202 to the second read control circuit 2044.

The first read control circuit 2042 is respectively connected to the first read input cache circuit 2043 and the read output cache circuit 2041, to send the stored data obtained from the first read input cache circuit 2043 to the read output cache circuit 2041.

The second read control circuit 2044 is respectively connected to the second read input cache circuit 2045 and the read output cache circuit 2041, to send the stored data obtained from the second read input cache circuit 2045 to the read output cache circuit 2041.

The read output cache circuit 2041 is respectively connected to the first read control circuit 2042, the second read control circuit 2044 and the read bus 205, to send the stored data obtained from the first read control circuit 2042 and the second read control circuit 2044 to the read bus 205.

The first read input cache circuit 2043 is connected to the first bank group 201 through the first read-write bus 207, and the second read input cache circuit 2045 is connected to the second bank group 202 through the second read-write bus 208. In some embodiments of the present disclosure, the stored data in the first bank group 201 may be read onto the read bus 205 through the first read input cache circuit 2043, the first read control circuit 2042, and the read output cache circuit 2041 in FIG. 2. The stored data in the second bank group 202 may be read onto the read bus 205 through the second read input cache circuit 2045, the second read control circuit 2044, and the read output cache circuit 2041.

As can be seen from FIG. 3, the write circuit 203 includes: a write input cache circuit 2031, a write control circuit 2036, a first write output cache circuit 2033, and a second write output cache circuit 2035.

The write input cache circuit 2031 is respectively connected to the write bus 206 and the write control circuit 2036, to send the stored data obtained from the write bus 206 to the write control circuit 2036.

The write control circuit 2036 is respectively connected to the write input cache circuit 2031, the first write output cache circuit 2033 and the second write output cache circuit 2035, to send the stored data sent by the write input cache circuit 2031 to the first write output cache circuit 2033 or the second write output cache circuit 2035.

The first write output cache circuit 2033 is connected to the first bank group 201, to send the stored data sent by the write control circuit 2036 to the first bank group 201.

The second write output cache circuit 2035 is connected to the second bank group 202, to send the stored data sent by the write control circuit 2036 to the second bank group 202.

In some embodiments of the present disclosure, the stored data on the write bus 206 may be written into the first bank group 201 through the write input cache circuit 2031, the write control circuit 2036 and the first write output cache circuit 2033 in FIG. 3. The stored data on the write bus 206 may be written into the second bank group 202 through the write input cache circuit 2031, the write control circuit 2036, and the second write output cache circuit 2035. In some embodiments, the write input cache circuit 2031 in FIG. 2 or FIG. 3 is configured to receive the stored data through a first control signal, and a frequency of the first control signal is the same as a clock frequency configured for writing the stored data.

In the process of receiving the stored data from the write bus 206, the write input cache circuit 2031 needs to rely on the frequency of the first control signal, wherein the frequency of the first control signal is a frequency at which the first control signal receives the stored data. For example, the first control signal may be a clock signal, and the stored data on the write bus 206 may be transferred to the write input cache circuit 2031 on a rising edge or a falling edge of each clock signal.

It is to be understood that when the frequency of the first control signal is greater than the clock frequency configured for writing the stored data, the write input cache circuit 2031 has no stored data to receive at some moments, which wastes resources of the write input cache circuit 2031. When the frequency of the first control signal is less than the clock frequency configured for writing the stored data, the write input cache circuit 2031 may miss a part of the stored data needing to be written. In some embodiments of the present disclosure, the frequency of the first control signal may be equal to the clock frequency configured for writing the stored data, which may not only save the resources but also avoid the omission of the stored data needing to be written.

In some embodiments, the first write output cache circuit 2033 in FIG. 2 or FIG. 3 writes the stored data into the first bank group 201 through a second control signal, and the second write output cache circuit 2035 writes the stored data into the second bank group 202 through a third control signal. The frequency of the second control signal and the frequency of the third control signal both are half of the frequency of the first control signal, and the falling edge of the second control signal and the falling edge of the third control signal alternate.

It is to be understood that the write circuit 203 is configured to alternately write the stored data into the first bank group 201 and the second bank group 202, such that the falling edge of the second control signal and the falling edge of the third control signal alternate. For the write circuit 203 as shown in FIG. 2, when the falling edge of the second control signal occurs, the first write output cache circuit 2033 writes the stored data obtained from the first write control circuit 2032 into the first bank group 201. When the falling edge of the third control signal occurs, the second write output cache circuit 2035 writes the stored data obtained from the second write control circuit 2034 into the second bank group 202. It is to be noted that falling edge drive of the control signal does not constitute a limitation on a drive mode, and rising edge drive or level drive may also be employed in some embodiments.

For the write circuit 203 as shown in FIG. 3, when the falling edge of the second control signal occurs, the first write output cache circuit 2033 writes the stored data obtained from the write control circuit 2036 into the first bank group 201. When the falling edge of the third control signal occurs, the second write output cache circuit 2035 writes the stored data obtained from the write control circuit 2036 into the second bank group 202.

In addition, an arrival frequency of the falling edge of the second control signal and an arrival frequency of the falling edge of the third control signal both are half of the frequency of the first control signal, i.e., half of the clock frequency configured for writing the stored data. In this way, the stored data on the write bus 206 can be written uniformly and alternately into the first bank group 201 and the second bank group 202. For example, the stored data are written into the first bank group 201 and the second bank group 202 in the following order: the first bank group 201-the second bank group 202-the first bank group 201-the second bank group 202- . . . -the first bank group 201-the second bank group 202, and so on.

As can be seen from FIG. 3, the read circuit 204 includes: a read output cache circuit 2041, a read control circuit 2046, a first read input cache circuit 2043, and a second read input cache circuit 2045.

The first read input cache circuit 2043 is connected to the first bank group 201, to read the stored data from the first bank group 201.

The second read input cache circuit 2045 is connected to the second bank group 202, to read the stored data from the second bank group 202.

The read control circuit 2046 is respectively connected to the first read input cache circuit 2043 and the second read input cache circuit 2045, to send the stored data sent by the first read input cache circuit 2043 or the second read input cache circuit 2045 to the read output cache circuit 2041.

The read output cache circuit 2041 is respectively connected to the read control circuit 2046 and the read bus 205, to send the stored data obtained from the read control circuit 2046 to the read bus 205.

The first read input cache circuit 2043 is connected to the first bank group 201 through the first read-write bus 207, and the second read input cache circuit 2045 is connected to the second bank group 202 through the second read-write bus 208. In some embodiments of the present disclosure, the stored data may be read from the first bank group 201 into the read bus 205 through the read output cache circuit 2041, the read control circuit 2046 and the first read input cache circuit 2043 in the read circuit 204. The stored data may be read from the second bank group 202 into the read bus 205 through the read output cache circuit 2041, the read control circuit 2046 and the second read input cache circuit 2045 in the read circuit 204.

It is to be noted that time intervals of the data in the write control circuit 1012, the write control circuit 1015, the read control circuit 1022 and the read control circuit 1025 in FIG. 1 are equal, which may be, for example, 5 ns. The time intervals of the data in the write control circuit 2036 and the read control circuit 2046 in FIG. 3 both are half of the time interval of the data in the write control circuit 1012 in FIG. 1, which may be, for example, 2.5 ns.

Figure 14:
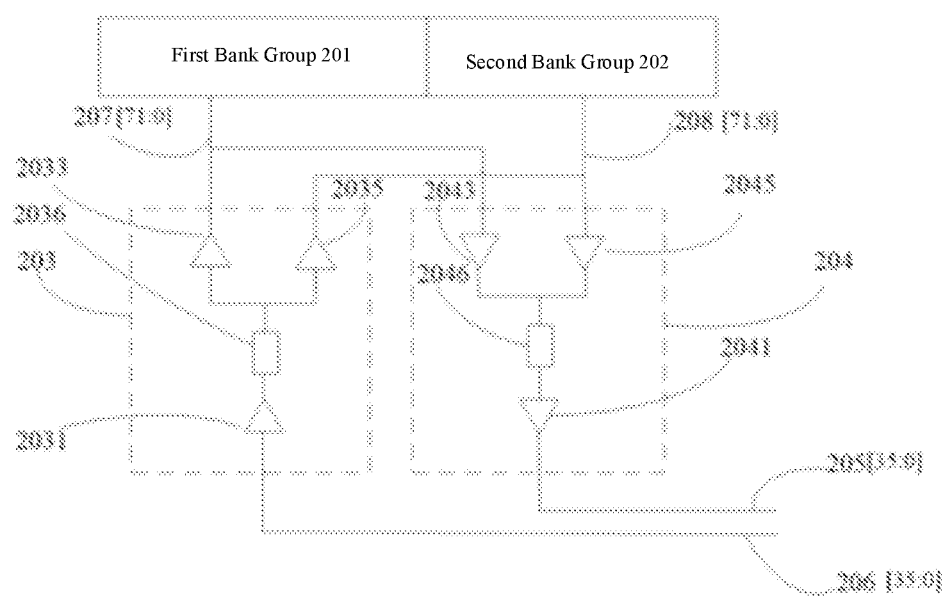
FIG. 14 and FIG. 15 schematically illustrate schematic structural diagrams of two data processing circuits according to some embodiments of the present disclosure.

Number of bits of the read bus 205, the write bus 206, the first read/write bus 207 and the second read/write bus 208 in FIG. 3 may be selected according to actual application scenarios. FIG. 14 schematically illustrates a schematic structural diagram of a data processing circuit according to some embodiments of the present disclosure. As can be seen from FIG. 14, when the read bus 205 and the write bus 206 both have 36 (i.e., [35:0]) bits, the first read-write bus 207 and the second read-write bus 208 both may have 72 (i.e., [71:0]) bits. In this way, data writing and data reading may be performed at the same time for the same bank group. For example, when data are written into the first bank group 201 through the [35:0] bits of the write bus 206 and the first read-write bus 207, the data may also be read from the first bank group 201 through the [71:36] bits of the read bus 205 and the first read-write bus 207. It is to be noted that the data processing circuit in FIG. 14 may comprise a plurality of sub-circuits, for example, nine sub-circuits. Each of the plurality of sub-circuits is the same as the circuit in FIG. 14 in structure. However, the write bus 206 and the read bus 205 of each of the plurality of sub-circuits both have four (i.e., [3:0]) bits, and the first read-write bus 207 and the second read-write bus 208 both have eight (i.e., [7:0]) bits. Furthermore, all the plurality of sub-circuits have the same first bank group and the same second bank group.

In some embodiments, the first read input cache circuit 2043 in FIG. 2 or FIG. 3 is configured to read the stored data through a fourth control signal, and the second read input cache circuit 2045 is configured to read the stored data through a fifth control signal. A frequency of the fourth control signal is the same as that of the fifth control signal, and a falling edge of the fourth control signal and a falling edge of the fifth control signal alternate.

It is to be understood that the read circuit 204 is configured to alternately read the stored data from the first bank group 201 and the second bank group 202, such that the falling edge of the fourth control signal and the falling edge of the fifth control signal alternate. When the falling edge of the fourth control signal occurs, the first read input cache circuit 2043 reads the stored data from the first bank group 201. When the falling edge of the fifth control signal occurs, the second read input cache circuit 2045 reads the stored data from the second bank group 202.

In addition, an arrival frequency of the falling edge of the fourth control signal is equal to an arrival frequency of the falling edge of the fifth control signal. In this way, the stored data may be uniformly and alternately read from the first bank group 201 and the second bank group 202. For example, the stored data are read from the first bank group 201 and the second bank group 202 in the following order: the first bank group 201-the second bank group 202-the first bank group 201-the second bank group 202- . . . -the first bank group 201-the second bank group 202, and so on.

In some embodiments, the read output cache circuit 2041 in FIG. 2 or FIG. 3 is configured to send the stored data to the read bus 205 through a sixth control signal, and a frequency of the sixth control signal is twice that of the fourth control signal.

The frequency of the sixth control signal is the arrival frequency of the falling edge of the sixth control signal. When the falling edge of the sixth control signal arrives, the read output cache circuit 2041 sends the stored data to the read bus 205. The read output cache circuit 2041 not only sends, to the read bus 205, the stored data read from the first bank group 201 by the first read input cache circuit 2043, but also needs to send, to the read bus 205, the stored data read from the second bank group 202 by the second read input cache circuit 2045. Thus, the frequency of the sixth control signal is twice that of the fourth control signal.

When the falling edge of the fourth control signal and the falling edge of the fifth control signal alternate, the read output cache circuit 2041 can alternately send the stored data in the first bank group 201 and the stored data in the second bank group 202 to the read bus 205.

In some embodiments, the first read-write bus 207 and the second read-write bus 208 are arranged crosswise. The first read-write bus 207 includes a first sub-bus with a plurality of bits, and the second read-write bus 208 includes a second sub-bus with a plurality of bits. After extending to the same height, the first sub-bus and the second sub-bus corresponding to the same bit are connected to the first bank group 201 and the second bank group 202, respectively.

Figure 4:
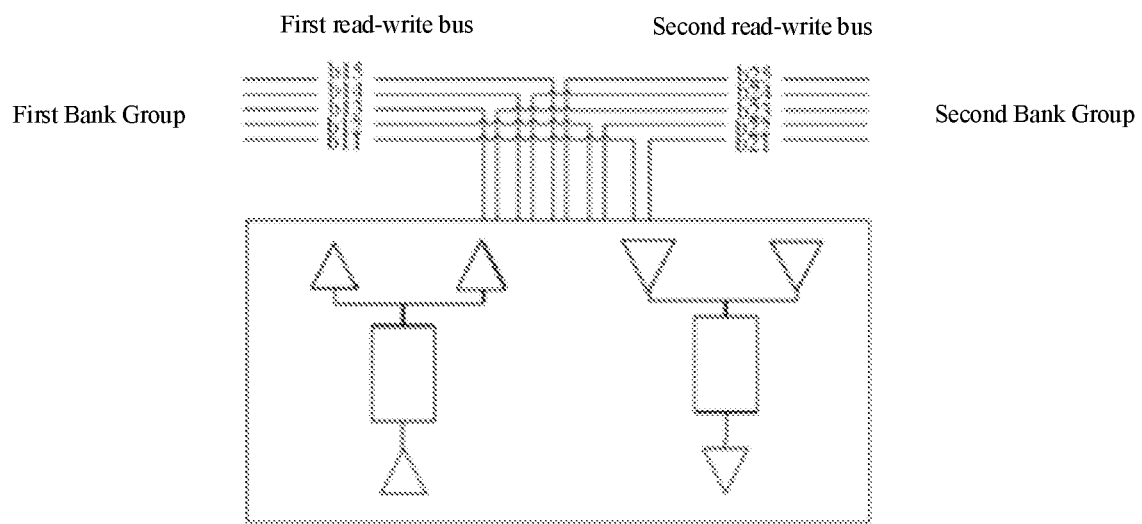
FIG. 4 schematically illustrates a schematic diagram showing arrangements of a first read-write bus and a second read-write bus according to some embodiments of the present disclosure.

In practical applications, the first sub-bus with a plurality of bits can implement multi-bit parallel reading or multi-bit parallel writing of the first bank group 201, and the second sub-bus with a plurality of bits can implement multi-bit parallel reading or multi-bit parallel writing of the second bank group 202. FIG. 4 schematically illustrates a schematic diagram showing arrangements of the first read-write bus and the second read-write bus according to some embodiments of the present disclosure. As shown in FIG. 4, the first read-write bus 207 includes 5-bit first sub-buses: b11, b12, b13, b14, and b15; and the second read-write bus 208 includes 5-bit second sub-buses: b21, b22, B23, b24, and b25. The b11 and the b21 are of the same bit, the b12 and the b22 are of the same bit, the b13 and the b23 are of the same bit, the b14 and the b24 are of the same bit, and the b15 and the b25 are of the same bit. As can be seen, after the b11 and the b21 extend to the same height, the b11 is connected to the first bank group 201, the b12 is connected to the second bank group 202, and so on.

As can be seen from FIG. 4, the first sub-buses included in the first read-write bus 207 and the second sub-buses included in the second read-write bus 208 are arranged crosswise.

In some embodiments of the present disclosure, the arrangement mode of the above read-write buses allows the first sub-buses and the second sub-buses with the same bit to share one horizontal lane, which helps to reduce the number of lanes and thereby reduce the size of the data processing circuit.

In some embodiments, the write circuit 203 and the read circuit 204 are arranged in parallel on a first straight line, the first bank group 201 and the second bank group 202 are arranged in parallel on a second straight line, and the first straight line is in parallel to the second straight line.

It is to be noted that the first straight line and the second straight line parallel to each other but do not overlap with each other, which facilitates line connection between the write circuit 203 and the first bank group 201, line connection between the write circuit 203 and the second bank group 202, line connection between the read circuit 204 and the first bank group 201, and line connection between the read circuit 204 and the second bank group 202.

In some embodiments, a first region where the write circuit 203 and the read circuit 204 are positioned and a second region where the first bank group 201 and the second bank group 202 are positioned are arranged in parallel on a third straight line, and the third straight line is perpendicular to the first straight line.

It is to be understood that when the third straight line is perpendicular to the first straight line and the first straight line is parallel to the second straight line, the write circuit, the read circuit, the first bank group and the second bank group can form an approximate rectangle, which helps to minimize the size of the circuit.

Principles of writing data into the first bank group and the second bank group through one write circuit in a write process are described in detail hereinabove. Principles of writing data into the first bank group and the second bank group through two write circuits are described in detail hereinbelow.

Figure 5:
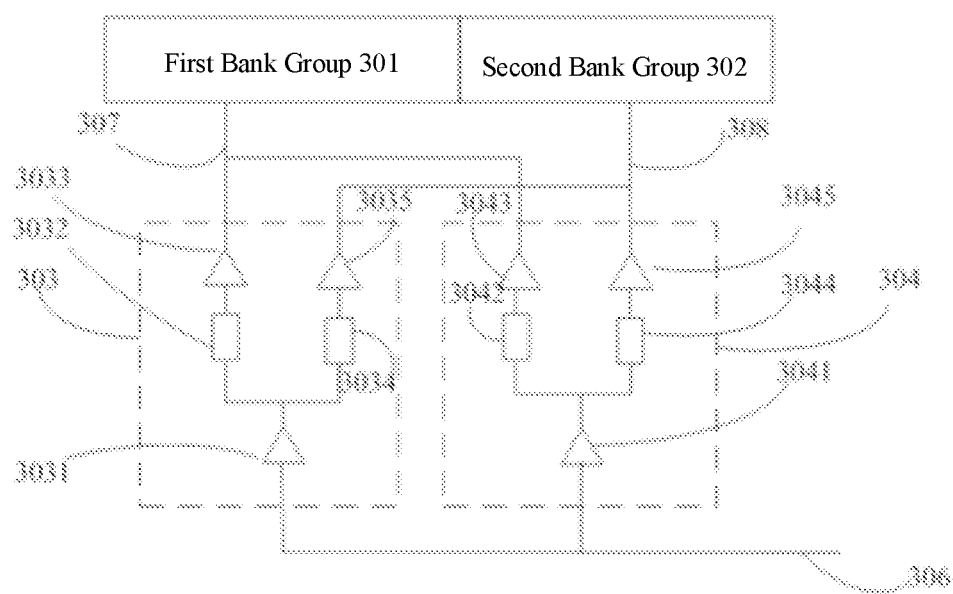
FIG. 5 and FIG. 6 schematically illustrate schematic structural diagrams of two data processing circuits according to some embodiments of the present disclosure.
Figure 6:
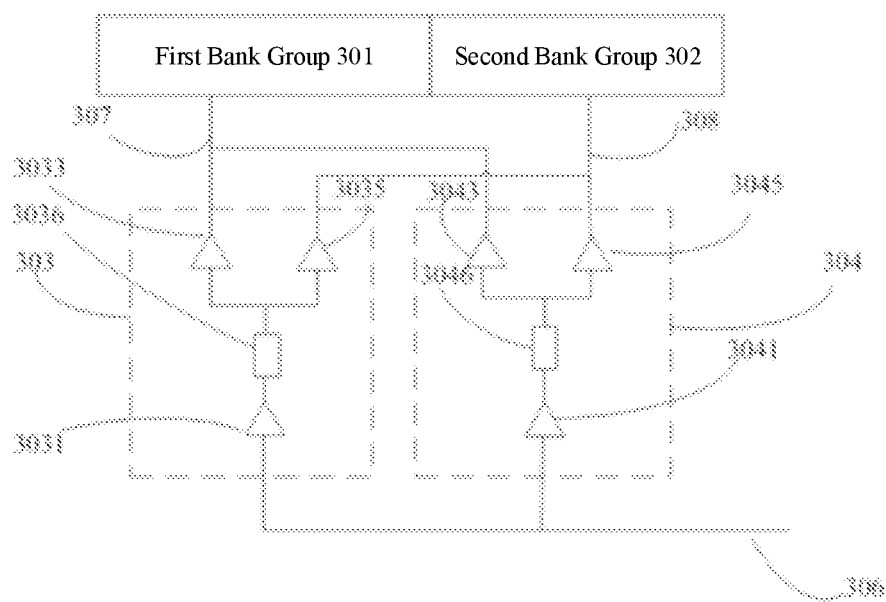

FIG. 5 and FIG. 6 schematically illustrate schematic structural diagrams of a third data processing circuit according to some embodiments of the present disclosure. With reference to FIG. 5 or FIG. 6, the data processing circuit substantially includes:

a first bank group 301 and a second bank group 302; and two write circuits 303 and 304. The write circuit 303 includes a write input cache circuit 3031, and the write circuit 304 includes a write input cache circuit 3041. The write circuits 303 and 304 are configured to: receive stored data from a same write bus 306 by means of the write input cache circuits 3031 and 3041 respectively, write the stored data into the first bank group 301 by means of a first read-write bus 307, and write the stored data into the second bank group 302 by means of a second read-write bus 308. Frequencies of control signals employed by the two write input cache circuits 3031 and 3041 both are half of a clock frequency configured for writing the stored data by the write bus 306, and falling edges of the control signals alternate.

Reference may be made to the detailed description of the first bank group 201 and the second bank group 202 for the detailed description of the first bank group 301 and the second bank group 302, which is not repeated any more herein.

As can be seen from FIG. 5, the above write circuit 303 includes: a write input cache circuit 3031, a first write control circuit 3032, a second write control circuit 3034, a first write output cache circuit 3033, and a second write output cache circuit 3035.

The write input cache circuit 3031 is respectively connected to the write bus 306, the first write control circuit 3032 and the second write control circuit 3034, to send the stored data obtained from the write bus 306 to the first write control circuit 3032 and the second write control circuit 3034.

The first write control circuit 3032 is respectively connected to the write input cache circuit 3031 and the first write output cache circuit 3033, to send the stored data sent by the write input cache circuit 3031 to the first write output cache circuit 3033.

The second write control circuit 3034 is respectively connected to the write input cache circuit 3031 and the second write output cache circuit 3035, to send the stored data sent by the write input cache circuit 3031 to the second write output cache circuit 3035.

The first write output cache circuit 3033 is respectively connected to the first write control circuit 3032 and the first bank group 301, to send the stored data sent by the first write control circuit 3032 to the first bank group 301.

The second write output cache circuit 3035 is respectively connected to the second write control circuit 3034 and the second bank group 302, to send the stored data sent by the second write control circuit 3034 to the second bank group 302.

The first write output cache circuit 3033 is connected to the first bank group 301 through the first read-write bus 307, and the second write output cache circuit 3035 is connected to the second bank group 302 through the second read-write bus 308. In some embodiments of the present disclosure, the stored data in the write bus 306 may be written into the first bank group 301 through the write input cache circuit 3031, the first write control circuit 3032 and the first write output cache circuit 3033 in FIG. 5. The stored data in the write bus 306 may be written into the second bank group 302 through the write input cache circuit 3031, the second write control circuit 3034 and the second write output cache circuit 3035 in the write circuit 303.

The structure of the write circuit 304 is the same as that of the write circuit 303, and thus is not unnecessarily elaborated herein.

In some embodiments of the present disclosure, the stored data in the write bus 306 are written into the first bank group 301 in parallel through a first branch (a circuit comprising the write input cache circuit 3031, the first write control circuit 3032, and the first write output cache circuit 3033) and a second branch (a circuit comprising the write input cache circuit 3041, the first write control circuit 3042, and the first write output cache circuit 3043) in FIG. 5. The stored data in the write bus 306 are written into the second bank group 302 in parallel through a third branch (a circuit comprising the write input cache circuit 3031, the second write control circuit 3034, and the second write output cache circuit 3035) and a fourth branch (a circuit comprising the write input cache circuit 3041, the second write control circuit 3044, and the second write output cache circuit 3045) in FIG. 5.

As shown in FIG. 5, the first branch and the second branch serve for parallel write. In some embodiments, four branches or eight branches may serve for parallel write. The number of the write branches may be determined according to the number of bits of the write bus 306, which is not limited here.

As can be seen from FIG. 6, the write circuit 303 includes: a write input cache circuit 3031, a write control circuit 3036, a first write output cache circuit 3033, and a second write output cache circuit 3035.

The write input cache circuit 3031 is respectively connected to the write bus 306 and the write control circuit 3036, to send the stored data obtained from the write bus 306 to the write control circuit 3036.

The write control circuit 3036 is respectively connected to the write input cache circuit 3031, the first write output cache circuit 3033 and the second write output cache circuit 3035 of the write circuit 303, to send the stored data sent by the write input cache circuit 3031 to the first write output cache circuit 3033 or the second write output cache circuit 3035.

The first write output cache circuit 3033 is connected to the first bank group 301, to send the stored data sent by the write control circuit 3036 to the first bank group 301.

The second write output cache circuit 3035 is connected to the second bank group 302, to send the stored data sent by the write control circuit 3036 to the second bank group 302.

Similarly, the structure of the write circuit 304 is the same as that of the write circuit 303, and thus is not unnecessarily elaborated herein.

In some embodiments of the present disclosure, the stored data in the write bus 306 are written into the first bank group 301 in parallel through a first branch (a circuit comprising the write input cache circuit 3031, the write control circuit 3036, and the first write output cache circuit 3033) and a second branch (a circuit comprising the write input cache circuit 3041, the write control circuit 3046, and the first write output cache circuit 3043) in FIG. 6. The stored data in the write bus 306 are written into the second bank group 302 in parallel through a third branch (a circuit comprising the write input cache circuit 3031, the write control circuit 3036, and the second write output cache circuit 3035) and a fourth branch (a circuit comprising the write input cache circuit 3041, the write control circuit 3046, and the second write output cache circuit 3045) in FIG. 6.

As shown in FIG. 6, the first branch and the second branch serve for parallel write. In some embodiments, four branches or eight branches may serve for parallel write. The number of the write branches may be determined according to the number of bits of the write bus 306, which is not limited here.

It is to be noted that time intervals of the data in the write control circuit 1012, the write control circuit 1015, the read control circuit 1022 and the read control circuit 1025 in FIG. 1 are equal, which may be, for example, 5 ns. The time intervals of the data in the write control circuits 3036 and 3046 in FIG. 6 both are half of the time interval of the data in the write control circuit 1012 in FIG. 1, which may be, for example, 2.5 ns.

Figure 15:
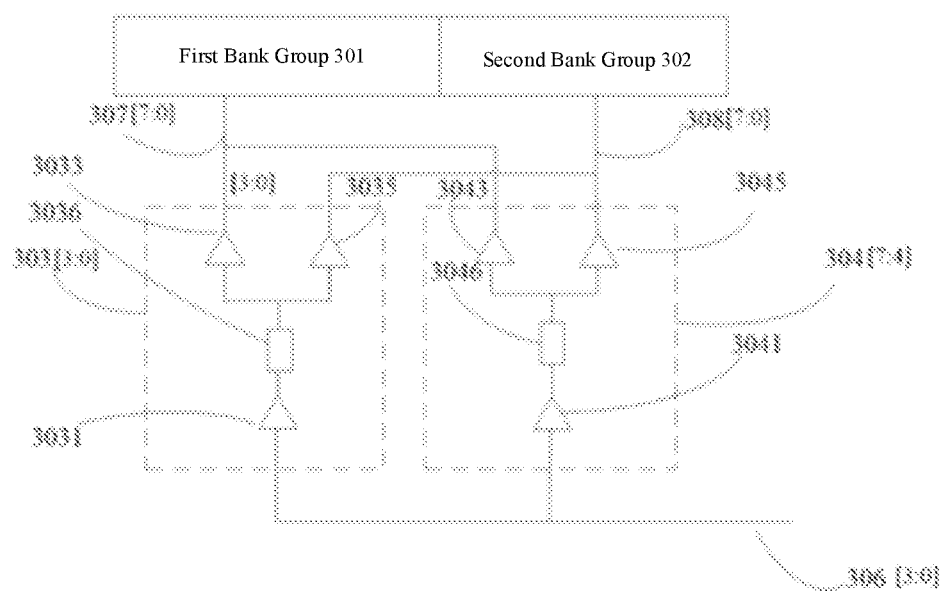

Number of bits of the write bus 306, the first read/write bus 307 and the second read/write bus 308 in FIG. 6 may be selected according to actual application scenarios. FIG. 15 schematically illustrates a schematic structural diagram of another data processing circuit according to some embodiments of the present disclosure. As can be seen from FIG. 15, when the write bus 306 has 4 (i.e., [3:0]) bits, the first read-write bus 307 and the second read-write bus 308 both may have 8 (i.e., [7:0]) bits. In this way, two successive 4 bits of the write bus 306 may be synchronously written into the first bank group 201 through the [3:0] bits and the [7:4] bits of the first read-write bus 307 respectively, or, two successive 4 bits of the write bus 306 may be synchronously written into the second bank group 202 through the [3:0] bits and the [7:4] bits of the second read-write bus 308 respectively.

As can also be seen from FIG. 15, for the first bank group 201, the write circuit 303 may be configured to write 4 (i.e., [3:0]) bits to the first bank group 201, and the write circuit 304 may be configured to write 4 (i.e., [7:4]) bits to the first bank group 201. Similarly, for the second bank group 202, the write circuit 303 may be configured to write 4 (i.e., [3:0]) bits to the second bank group 202, and the write circuit 304 may be configured to write 4 (i.e., [7:4]) bits to the second bank group 202.

FIG. 15 includes two write circuits. In practical applications, the data processing circuit may also include at least two write circuits, and the connection mode between the at least two write circuits is the same as the connection mode as shown in FIG. 15. For example, when the write bus 306 has 36 (i.e., [35:0]) bits, the first read-write bus 307 and the second read-write bus 308 may have 72 (i.e., [71:0]) bits, such that the number of the write circuits included is 18. That is, nine groups of the data processing circuits as shown in FIG. 15 are included.

In some embodiments, the first write output cache circuits 3033 and 3043 of the two write circuits 303 and 304 in FIG. 5 or FIG. 6 employ the same second control signal, and the second write output cache circuits 3035 and 3045 of the two write circuits 303 and 304 employ the same third control signal. The frequency of the second control signal and the frequency of the third control signal both are a quarter of the clock frequency configured for writing the stored data, and the falling edge of the second control signal and the falling edge of the third control signal alternate.

Figure 7:
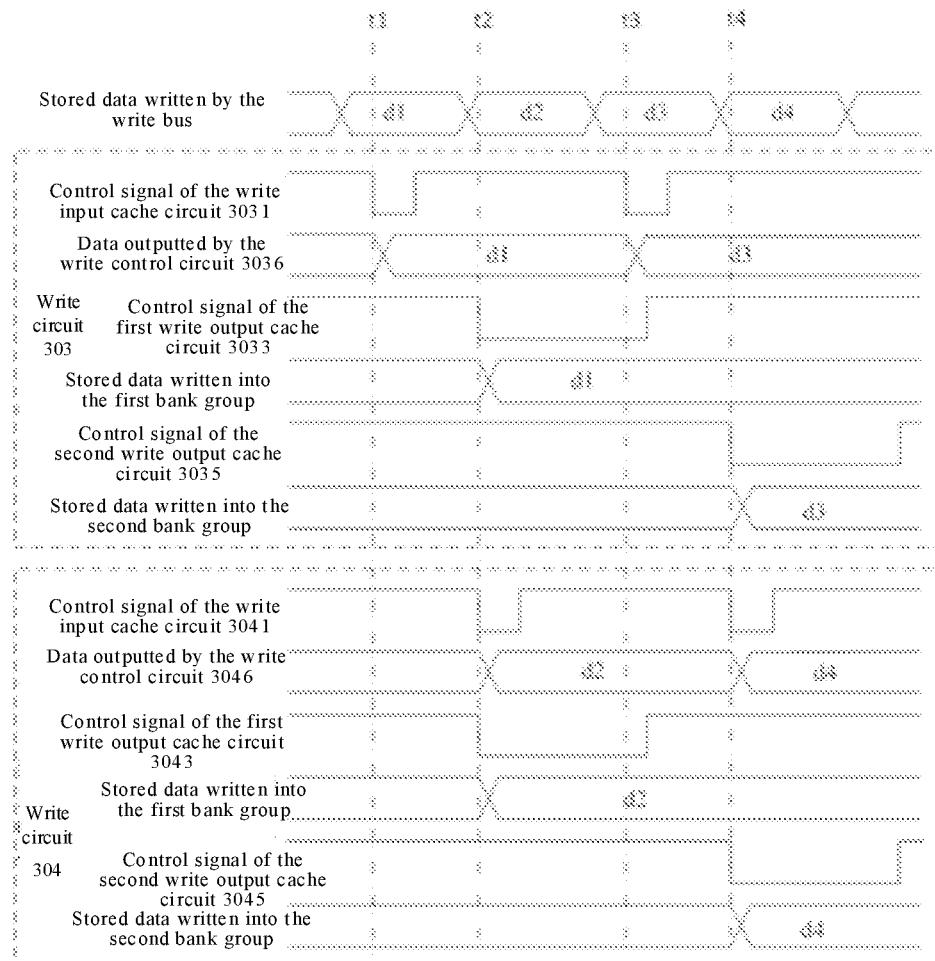
FIG. 7 schematically illustrates a timing diagram of a data write process according to some embodiments of the present disclosure.

FIG. 7 schematically illustrates a timing diagram according to some embodiments of the present disclosure, and FIG. 7 is a timing diagram corresponding to the data processing circuit in FIG. 6. As can be seen from FIG. 7, the frequencies of the control signals employed by the write input cache circuits 3031 and 3041 of the two write circuits 303 and 304 both are half of the clock frequency configured for writing the stored data by the write bus 306. That is, a frequency of occurrence of the falling edge of the write input cache circuit 3031 and a frequency of occurrence of the falling edge of the write input cache circuit 3041 both are half of the frequency of writing the stored data. In addition, as can also be seen, the falling edge of the write input cache circuit 3031 and the falling edge of the write input cache circuit 3041 alternate.

At a moment t1, the falling edge of the control signal of the write input cache circuit 3031 arrives, such that the write control circuit 3036 outputs the currently received stored data d1. At a moment t2, the falling edge of the control signal of the write input cache circuit 3041 arrives, such that the write control circuit 3046 outputs the currently received stored data d2. Meanwhile, at the moment t2, the falling edge of the control signal of the first write output cache circuit 3033 arrives, such that the first write output cache circuit 3033 writes the stored data d1 outputted by the write control circuit 3036 into the first bank group 301. Meanwhile, at the moment t2, the falling edge of the control signal of the first write output cache circuit 3043 arrives, such that the first write output cache circuit 3043 writes the stored data d2 outputted by the write control circuit 3046 into the second bank group 302. As can be seen, through the above process, the stored data d1 and the stored data d2 outputted at different moments are written into the first bank group 301 at the same moment t2.

Similarly, at a moment t3, the falling edge of the control signal of the write input cache circuit 3031 arrives, such that the write control circuit 3036 outputs the currently received stored data d3. At a moment t4, the falling edge of the control signal of the write input cache circuit 3041 arrives, such that the write control circuit 3046 outputs the currently received stored data d4. Meanwhile, at the moment t4, the falling edge of the control signal of the second write output cache circuit 3035 arrives, such that the second write output cache circuit 3035 writes the stored data d3 outputted by the write control circuit 3036 into the second bank group 302. Meanwhile, at the moment t4, the falling edge of the control signal of the second write output cache circuit 3045 arrives, such that the second write output cache circuit 3045 writes the stored data d4 outputted by the write control circuit 3046 into the second bank group 302. As can be seen, through the above process, the stored data d3 and the stored data d4 outputted at different moments are written into the second bank group 302 at the same moment t4.

When the write bus in FIG. 6 has 4 bits, the stored data d1, d2, d3 and d4 in FIG. 7 may all are 4 bits, wherein the d1 represents the [3:0] bits written into the first bank group 301, the d2 represents the [7:4] bits written into the first bank group 301, the d3 represents the [3:0] bits written into the second bank group 302, and the d4 represents the [7:4] bits written into the second bank group 302.

In some embodiments, with reference to FIG. 6, the frequencies of the control signals employed by the write control circuits 3036 and 3046 of the two write circuits 303 and 304 are equal to the frequencies of the control signals employed by the write input cache circuits 3031 and 3041. In this way, the stored data sent by the write input cache circuits 3031 and 3041 may be received synchronously, to avoid the loss of the stored data.

In some embodiments, the first write output cache circuit and the second write output cache circuit of one of the two write circuits both employ a full latch, and the first write output cache circuit and the second write output cache circuit of the other one of the two write circuits both employ a half latch. The write control circuit of the write circuit is configured to control data write based on a time delay between column address strobes, wherein the time delay between the column address strobes includes four clock cycles.

As a memory cell circuit sensitive to a pulse level or rising edge or falling edge, a latch is configured for data cache. In some embodiments of the present disclosure, the write input cache circuit, the first write output cache circuit, the second write output cache circuit, the first read input cache circuit, the second read input cache circuit and the read output cache circuit all are latches.

In some embodiments of the present disclosure, for the write circuit, the stored data in the write bus 306 are serialized in time. To synchronously write the serialized stored data into the first bank group 301 or the second bank group 302, the write circuit that previously receives the stored data needs to wait for the write circuit that subsequently receives the stored data, such that the first write output cache circuit and the second write output cache circuit in the write circuit that previously receives the stored data may employ full latches, and the first write output cache circuit and the second write output cache circuit in the write circuit that subsequently receives the stored data may employ half latches. The full latch has a longer cache duration for the stored data than the half-latch, such that the two write circuits receiving the stored data in different time can synchronously write the stored data. In this way, a data write process of serial-parallel conversion can be implemented.

Figure 12:
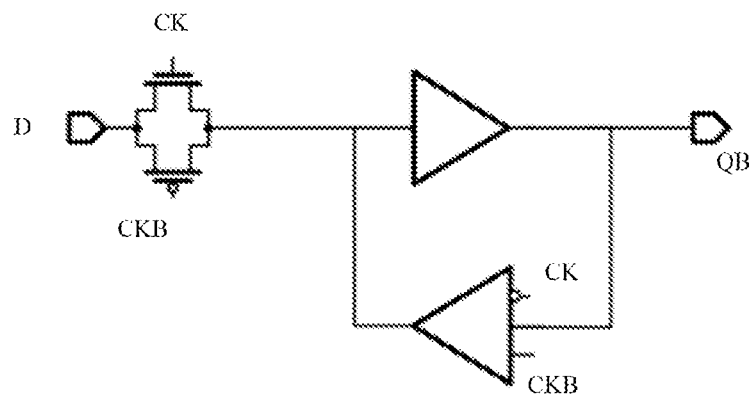
FIG. 12 schematically illustrates a schematic diagram showing a circuit structure of a half latch according to some embodiments of the present disclosure.
Figure 13:
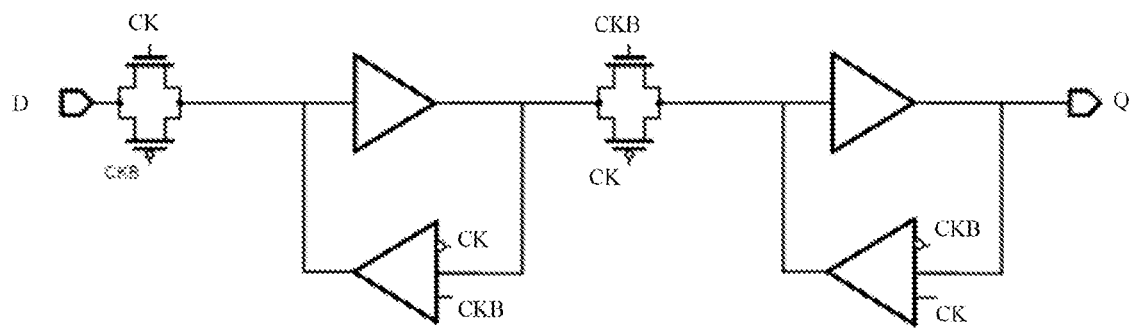
FIG. 13 schematically illustrates a schematic diagram showing a circuit structure of a full latch according to some embodiments of the present disclosure.

FIG. 12 schematically illustrates a schematic diagram showing a circuit structure of a half latch according to some embodiments of the present disclosure, and FIG. 13 schematically illustrates a schematic diagram showing a circuit structure of a full latch according to some embodiments of the present disclosure. As shown in FIG. 12 and FIG. 13, the full latch is obtained by connecting two half latches in series, wherein D represents a data input port, CK and CKB represent complementary clock ports, and Q and QB represent data output ports.

In some embodiments, the first read-write bus and the second read-write bus are arranged crosswise.

In some embodiments, the first read-write bus includes a first sub-bus with a plurality of bits, and the second read-write bus includes a second sub-bus with a plurality of bits. After extending to the same height, the first sub-bus and the second sub-bus corresponding to the same bit are connected to the first bank group and the second bank group, respectively.

In some embodiments, the two write circuits are arranged in parallel on a first straight line, the first bank group and the second bank group are arranged in parallel on a second straight line, and the first straight line is parallel to the second straight line.

It is to be noted that the first straight line and the second straight line parallel to each other but do not overlap with each other, which facilitates line connection between the write circuit and the first bank group, and line connection between the write circuit and the second bank group.

In some embodiments, a first region where the two write circuits are positioned and a second region where the first bank group and the second bank group are positioned are arranged in parallel on a third straight line, and the third straight line is perpendicular to the first straight line.

In some embodiments, the first bank group and the second bank group are different in data write time, and the first bank group is the same as the second bank group in data write logic. In this way, on a non-conflict basis of write, the write circuit of the first bank group and the write circuit of the second bank group having the same data write logic may be merged.

FIGS. 8 to 11 schematically illustrate schematic structural diagrams of four memories according to some embodiments of the present disclosure. With reference to FIGS. 8 to 11, the write circuits of the two data processing circuits are connected to the same write bus. For two data processing circuits having read circuits, the read circuits of the two data processing circuits are connected to the same read bus.

Figure 8:
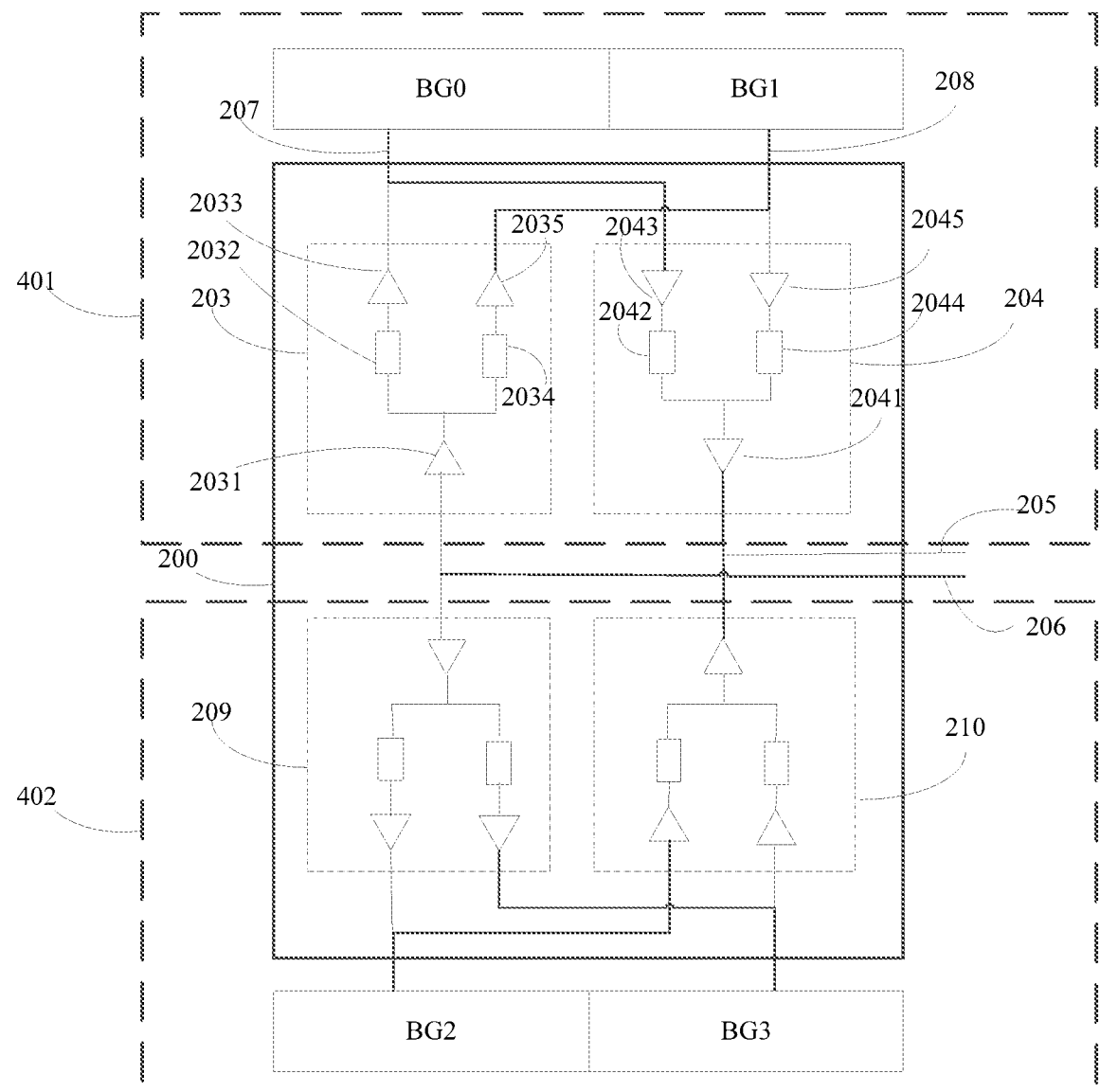
FIGS. 8 to 11 schematically illustrate schematic structural diagrams of four memories according to some embodiments of the present disclosure.
Figure 9:
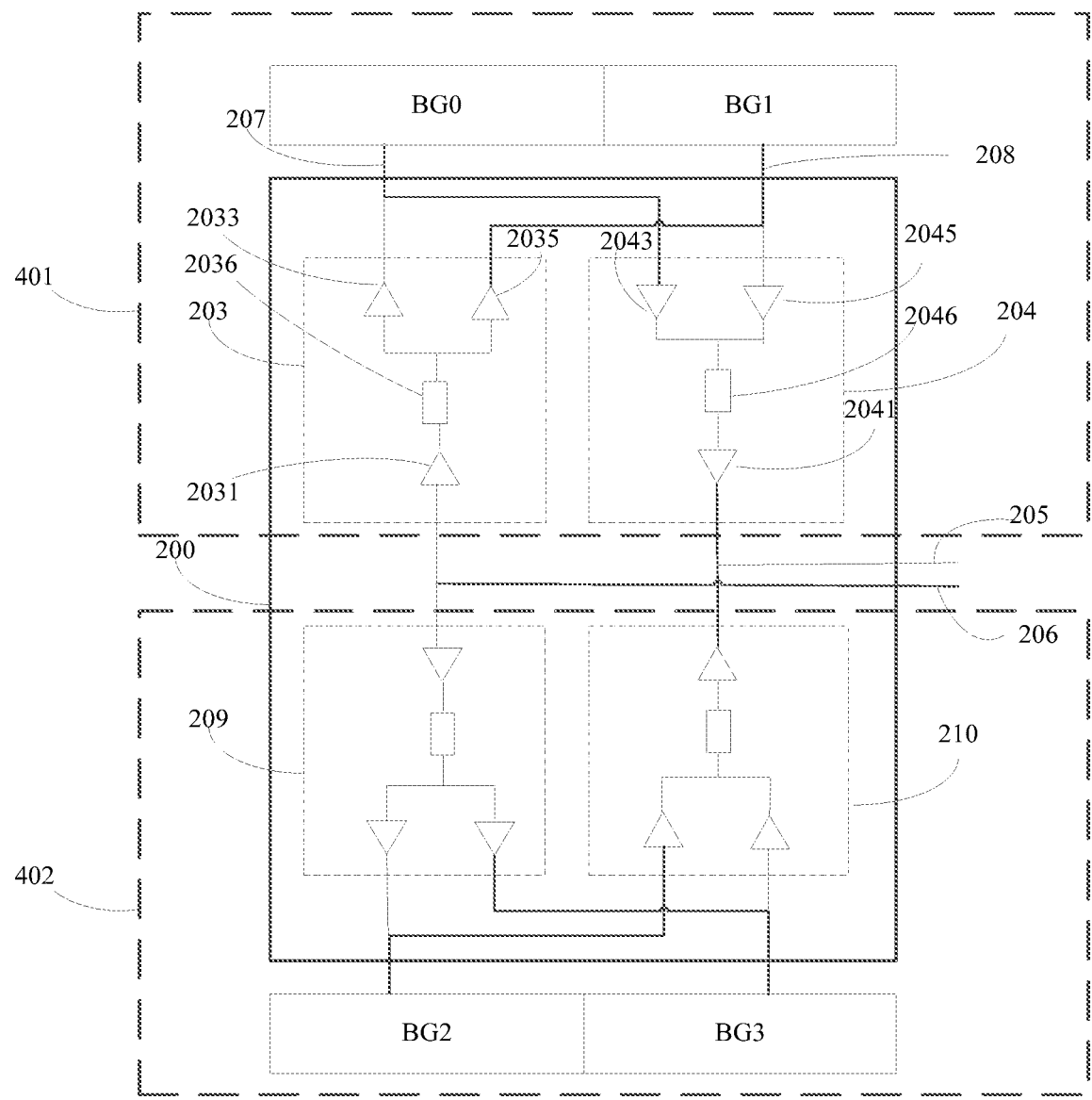

With reference to FIG. 8 or FIG. 9, one data processing circuit 401 includes: a first bank group BG0, a second bank group BG1, a write circuit 203, and a read circuit 204. The other data processing circuit 402 includes: a first bank group BG2, a second bank group BG3, a write circuit 209, and a read circuit 210. The two data processing circuits 401 and 402 in FIG. 8 have the same structure as the data processing circuit as shown in FIG. 2. The two data processing circuits 401 and 402 in FIG. 9 have the same structure as the data processing circuit as shown in FIG. 3.

Of course, the data processing circuit in FIG. 2 and the data processing circuit in FIG. 3 may constitute one memory.

That is, the memory includes one data processing circuit as shown in FIG. 2 and one data processing circuit as shown in FIG. 3.

Figure 10:
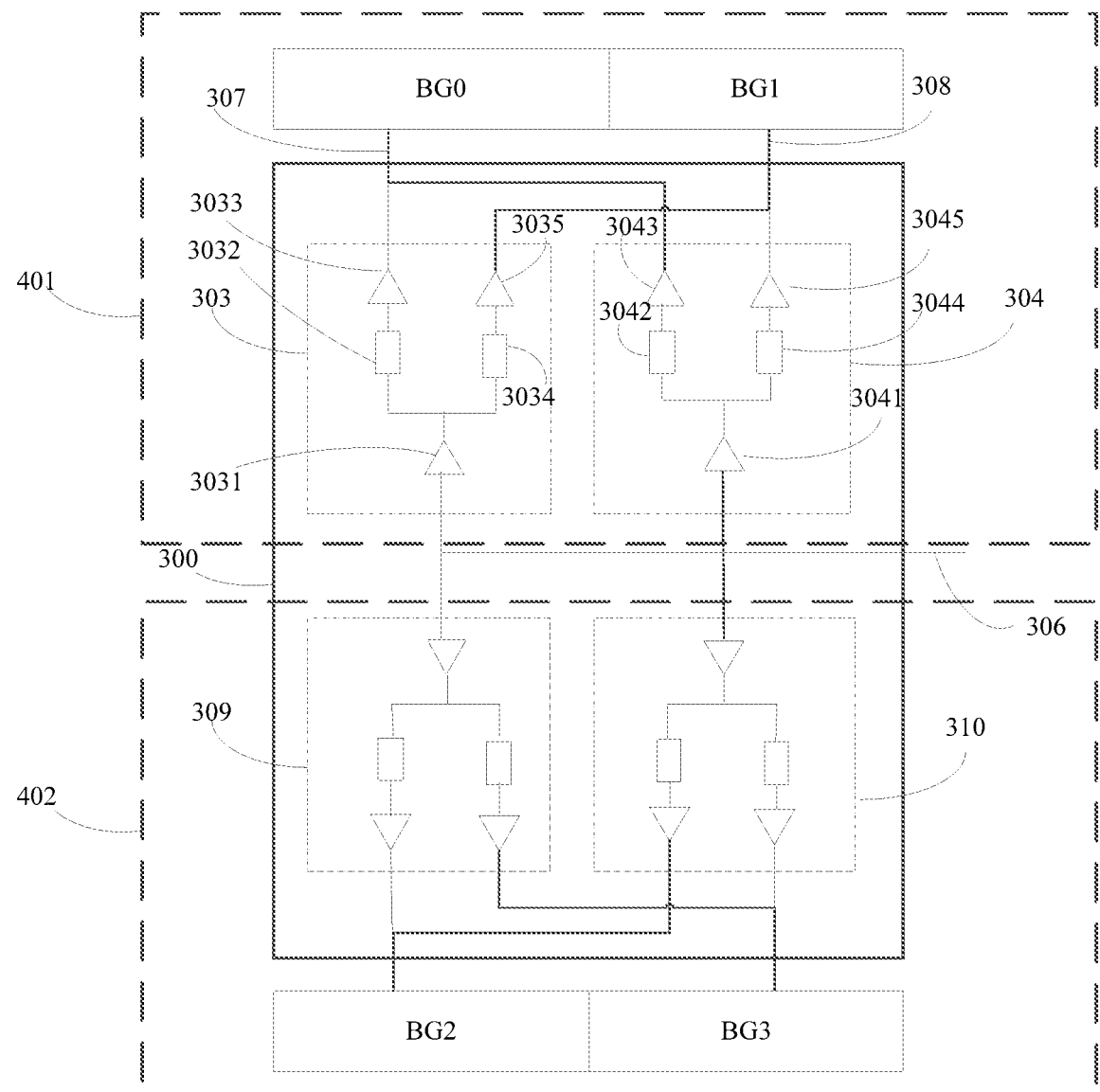
Figure 11:
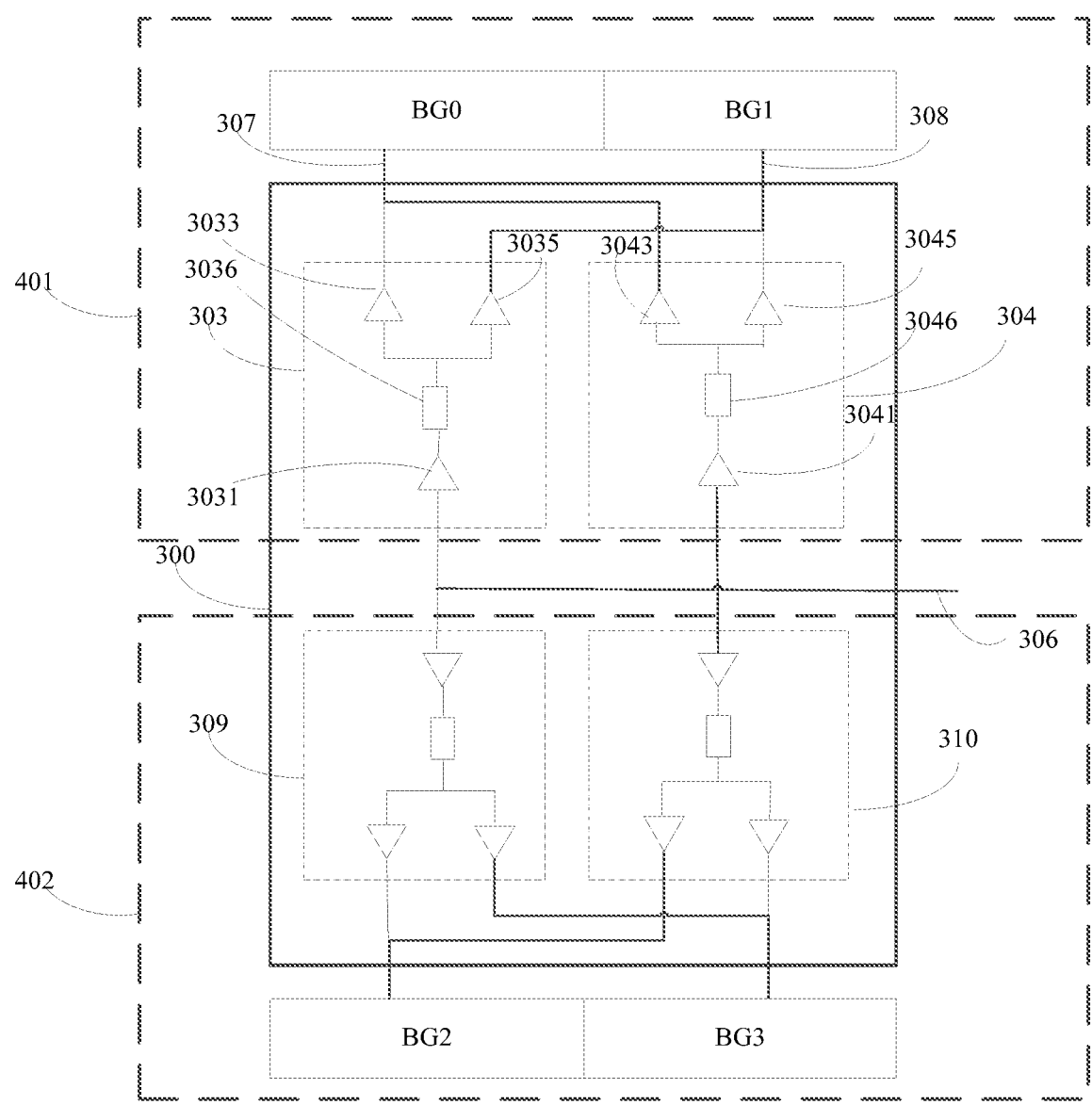

With reference to FIG. 10 or FIG. 11, one data processing circuit 401 includes: a first bank group BG0, a second bank group BG1, a write circuit 303, and a write circuit 304. The other data processing circuit 402 includes: a first bank group BG2, a second bank group BG3, a write circuit 309, and a write circuit 310. The two data processing circuits 401 and 402 in FIG. 10 have the same structure as the data processing circuit as shown in FIG. 5. The two data processing circuits 401 and 402 in FIG. 11 have the same structure as the data processing circuit as shown in FIG. 6.

Of course, the data processing circuit in FIG. 5 and the data processing circuit in FIG. 6 may constitute one memory. That is, the memory includes one data processing circuit as shown in FIG. 5 and one data processing circuit as shown in FIG. 6.

In some embodiments, the memory is a double data rate dynamic random access memory (DDR DRAM).

In some embodiments, the write circuits of the two data processing circuits are positioned in a central region, wherein the first bank group and the second bank group of one of the two data processing circuits are positioned on a side of the central region, and the first bank group and the second bank group of the other one of the two data processing circuits are positioned on another side of the central region.

Similarly, the read circuits of the two data processing circuits are positioned in a central region, wherein the first bank group and the second bank group of one of the two data processing circuits are positioned on a side of the central region, and the first bank group and the second bank group of the other one of the two data processing circuits are positioned on another side of the central region.

As shown in FIG. 8 or FIG. 9, the write circuits 203 and 209 and the read circuits 204 and 210 are positioned in the central region 200, the first bank group BG0 and the second bank group BG1 in the data processing circuit 401 are positioned on an upper side of the central region 200, and the first bank group BG2 and the second bank group BG3 in the data processing circuit 402 are positioned on a lower side of the central region 200.

As shown in FIG. 10 or FIG. 11, the write circuits 303, 304, 309 and 310 are positioned in the central region 300, the first bank group BG0 and the second bank group BG1 in the data processing circuit 401 are positioned on an upper side of the central region 300, and the first bank group BG2 and the second bank group BG3 in the data processing circuit 402 are positioned on a lower side of the central region 300. In this way, it is facilitated the line connection between the bank groups and the read circuits and the write circuits.

In some embodiments of the present disclosure, there is further provided an electronic device, which includes the above memory.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

For the convenience of explanation, the above description has been made in conjunction with some embodiments. However, the above exemplary discussion is not intended to be exhaustive or to limit the embodiments to the concrete forms disclosed above. Various modifications and variations can be obtained in light of the above teachings. The embodiments are selected and described to better explain the principles and the practical applications, and to enable those skilled in the art to better utilize the embodiments and with various modifications as are suited to the particular use contemplated.

What is claimed is:

1. A data processing circuit, comprising:
    a first bank group and a second bank group;
    a write circuit, comprising only one write input cache circuit, the write circuit being configured to: receive stored data from a write bus through the write input cache circuit, write the stored data into the first bank group through a first read-write bus, and write the stored data into the second bank group through a second read-write bus; and
    a read circuit, comprising only one read output cache circuit, the read circuit being configured to: read the stored data from the first bank group through the first read-write bus, read the stored data from the second bank group through the second read-write bus, and transmit the stored data to a read bus through the read output cache circuit.

2. The data processing circuit according to claim 1, wherein the write circuit further comprises:
    a write control circuit, respectively connected to the write input cache circuit, a first write output cache circuit and a second write output cache circuit, the write control circuit being configured to transmit the stored data transmitted by the write input cache circuit to the first write output cache circuit or the second write output cache circuit;
    the first write output cache circuit, connected to the first bank group and configured to transmit the stored data transmitted by the write control circuit to the first bank group; and
    the second write output cache circuit, connected to the second bank group and configured to transmit the stored data transmitted by the write control circuit to the second bank group.

3. The data processing circuit according to claim 2, wherein the write input cache circuit is configured to receive the stored data through a first control signal, and a frequency of the first control signal being same as a clock frequency configured for writing the stored data.

4. The data processing circuit according to claim 3, wherein the first write output cache circuit is configured to write the stored data into the first bank group through a second control signal, the second write output cache circuit being configured to write the stored data into the second bank group through a third control signal, a frequency of the second control signal and a frequency of the third control signal both being a half of the frequency of the first control signal, and a falling edge of the second control signal and a falling edge of the third control signal alternating.

5. The data processing circuit according to claim 1, wherein read circuit comprises:
    a first read input cache circuit, connected to the first bank group and configured to read the stored data from the first bank group;

a second read input cache circuit, connected to the second bank group and configured to read the stored data from the second bank group; and a read control circuit respectively connected to the first read input cache circuit and the second read input cache circuit, the read control circuit being configured to transmit the stored data transmitted by the first read input cache circuit or the second read input cache circuit to the read output cache circuit.

6. The data processing circuit according to claim 5, wherein the first read input cache circuit is configured to read the stored data through a fourth control signal, the second read input cache circuit being configured to read the stored data through a fifth control signal, a frequency of the fourth control signal being same as that of the fifth control signal, and a falling edge of the fourth control signal and a falling edge of the fifth control signal alternating.

7. The data processing circuit according to claim 6, wherein the read output cache circuit is configured to transmit the stored data to the read bus through a sixth control signal, a frequency of the sixth control signal being twice that of the fourth control signal.

8. The data processing circuit according to claim 1, wherein the first read-write bus and the second read-write bus are arranged crosswise.

9. The data processing circuit according to claim 8, wherein the first read-write bus comprises a first sub-bus with a plurality of bits, the second read-write bus comprising a second sub-bus with a plurality of bits, and the first sub-bus and the second sub-bus corresponding to the same bit extending to a same height and being connected to the first bank group and the second bank group, respectively.

10. The data processing circuit according to claim 1, wherein the write circuit and the read circuit are arranged in parallel on a first straight line, the first bank group and the second bank group being arranged in parallel on a second straight line, and the first straight line being parallel to the second straight line.

11. The data processing circuit according to claim 10, wherein a first region where the write circuit and the read circuit are positioned and a second region where the first bank group and the second bank group are positioned are arranged in parallel on a third straight line, the third straight line being perpendicular to the first straight line.

12. The data processing circuit according to claim 1, wherein the first bank group and the second bank group are different in data read-write time, the first bank group being same as the second bank group in data read-write logic.

13. A memory, comprising two data processing circuits, each of the two data processing circuits comprising:

a first bank group and a second bank group;

a write circuit, comprising only one write input cache circuit, the write circuit being configured to: receive stored data from a write bus through the write input cache circuit, write the stored data into the first bank group through a first read-write bus, and write the stored data into the second bank group through a second read-write bus; and a read circuit, comprising only one read output cache circuit, the read circuit being configured to: read the stored data from the first bank group through the first read-write bus, read the stored data from the second bank group through the second read-write bus, and transmit the stored data to a read bus through the read output cache circuit;

wherein write circuits in the two data processing circuits are connected to same write bus, and read circuits in the two data processing circuits are connected to same read bus.

14. The memory according to claim 13, wherein the memory is a double data rate dynamic random access memory DDR DRAM.

15. The memory according to claim 13, wherein write circuits and read circuits of the two data processing circuits are positioned in a central region, the first bank group and the second bank group of one of the two data processing circuits being positioned on a side of the central region, and the first bank group and the second bank group of the other one of the two data processing circuits being positioned on another side of the central region.

16. An electronic device comprising a memory, wherein the memory comprises two data processing circuits, each of the two data processing circuits comprising:

a first bank group and a second bank group;

a write circuit, comprising only one write input cache circuit, the write circuit being configured to: receive stored data from a write bus through the write input cache circuit, write the stored data into the first bank group through a first read-write bus, and write the stored data into the second bank group through a second read-write bus; and a read circuit, comprising only one read output cache circuit, the read circuit being configured to: read the stored data from the first bank group through the first read-write bus, read the stored data from the second bank group through the second read-write bus, and transmit the stored data to a read bus through the read output cache circuit;

wherein write circuits in the two data processing circuits are connected to same write bus, and read circuits in the two data processing circuits are connected to same read bus.

* * * * *